United States Patent
Hiraoka et al.

(10) Patent No.: US 8,158,994 B2
(45) Date of Patent: Apr. 17, 2012

(54) GAN LED ELEMENT AND LIGHT EMITTING DEVICE HAVING A STRUCTURE TO REDUCE LIGHT ABSORPTION BY A PAD ELECTRODE INCLUDED THEREIN

(75) Inventors: Shin Hiraoka, Ushiku (JP); Hiroaki Okagawa, Ushiku (JP); Takahide Joichi, Ushiku (JP)

(73) Assignee: Mitsubishi Chemical Corporation, Tokyo (JP)

( * ) Notice: Subject to any disclaimer, the term of this patent is extended or adjusted under 35 U.S.C. 154(b) by 177 days.

(21) Appl. No.: 12/527,929

(22) PCT Filed: Feb. 20, 2008

(86) PCT No.: PCT/JP2008/052806
§ 371 (c)(1),
(2), (4) Date: Aug. 20, 2009

(87) PCT Pub. No.: WO2008/102787
PCT Pub. Date: Aug. 28, 2008

(65) Prior Publication Data
US 2010/0012971 A1    Jan. 21, 2010

(30) Foreign Application Priority Data

| Feb. 21, 2007 | (JP) | 2007-041528 |
| Feb. 28, 2007 | (JP) | 2007-050783 |
| Dec. 14, 2007 | (JP) | 2007-323248 |

(51) Int. Cl.
*H01L 33/00*    (2010.01)

(52) U.S. Cl. .................................. 257/96; 257/E33.025
(58) Field of Classification Search ................... 257/76, 257/96, E33.025, E33.068
See application file for complete search history.

(56) References Cited

U.S. PATENT DOCUMENTS
2009/0026475 A1 * 1/2009 Yamaguchi et al. ............ 257/98

FOREIGN PATENT DOCUMENTS
| JP | 2001-210867 | 8/2001 |
| JP | 2002-353506 | 12/2002 |
| JP | 2005-317931 | 11/2005 |
| WO | WO 2007074897 A1 * | 7/2007 |

OTHER PUBLICATIONS

English translation of JP-2002353506 made Apr. 10, 2010.*
International Search Report dated May 13, 2008 in International Application No. PCT/JP2008/052806.

\* cited by examiner

*Primary Examiner* — Thomas L Dickey
(74) *Attorney, Agent, or Firm* — Wenderoth, Lind & Ponack, L.L.P.

(57) ABSTRACT

A first conductive film 104-1 of a light-transmissive conductive oxide film 104 and a positive pad electrode 105 are electrically connected through a second conductive film 104-2 of the light-transmissive conductive oxide film 104 in a GaN-based LED element 100. A contact resistance of the light-transmissive conductive oxide film 104 with a p-type layer 102-3 in a first contact portion 104A is lower than in a second contact portion 104B, so that a current supplied from the positive pad electrode 105 to the p-type layer 102-3 through the conductive oxide film 104 flows to the p-type layer 102-3 mainly through the first contact portion 104A.

9 Claims, 14 Drawing Sheets

(a)

(b)

(a)

(b)

GAN LED ELEMENT AND LIGHT EMITTING DEVICE HAVING A STRUCTURE TO REDUCE LIGHT ABSORPTION BY A PAD ELECTRODE INCLUDED THEREIN

TECHNICAL FIELD

The present invention relates to a GaN-based LED element having a light emitting element structure composed of a GaN-based semiconductor, and a light emitting device using the GaN-based LED element.

BACKGROUND ART

The GaN-based semiconductor is a compound semiconductor represented by the chemical formula:

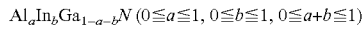

$$Al_aIn_bGa_{1-a-b}N\ (0 \leq a \leq 1,\ 0 \leq b \leq 1,\ 0 \leq a+b \leq 1)$$

which is also called a III group nitride semiconductor, a nitride-based semiconductor and the like. The GaN-based LED element having a light emitting element structure such as a pn junction structure, double heterostructure, and quantum well structure composed of the GaN-based semiconductor can generate green to near-ultraviolet light, and it has been put to practical use in applications such as a traffic light and a display device. While the GaN-based LED element has been increasingly studied and developed to be applied to illumination purpose at the present, a higher output power is said to be required for practical purpose.

FIG. 19 shows a structure example of a GaN-based LED element according to a conventional technique. As shown in a cross-sectional view in FIG. 19, a GaN-based LED element 10 has a substrate 11, and a semiconductor laminate 12 composed of a plurality of GaN-based semiconductor layers formed on the substrate. The semiconductor laminate 12 includes a p-type layer 12-3 arranged at the most distant position from the substrate 11, a light emitting layer 12-2 arranged between the p-type layer 12-3 and the substrate 11, and a n-type layer 12-1 arranged so as to sandwich the light emitting layer 12-2 with the p-type layer 12-3. A light-transmissive conductive oxide film 14 is formed on the p-type layer 12-3, and a positive pad electrode 15 is formed on the conductive oxide film 14. The conductive oxide film 14 is made of indium tin oxide (ITO), for example. In such a GaN-based LED element having a conductive oxide film as an electrode, light absorption by a pad electrode formed on the conductive oxide film is pointed out as a factor that hinders the increase in output power of the LED element, and as its remedy, it is proposed to make the pad electrode of a metal material with a high reflectance (patent document 1). In addition, a pad electrode is an electrode to which a material used for making connection with an external electrode, such as a bonding wire, conductive paste, and brazing filler metal (including solder and eutectic alloy), is bonded.

[patent document 1] JP-A-2005-317931
[patent document 2] JP-A-2001-210867

DISCLOSURE OF THE INVENTION

Problems to be Solved by the Invention

However, after studied by the inventors, it has been found that a metal material acts as a light absorber even if it is one with a high reflectance, and the improvement in output of the GaN-based LED element is limited when only relying on the improvement of the reflectivity of the pad electrode.

The present invention is made in view of the above situation, and its main object is to provide a GaN-based LED element having a structure in which light absorption by a pad electrode can be reduced.

It is another object of the present invention to provide a light emitting device superior in light emission efficiency by use of a GaN-based LED element having a structure in which light absorption by a pad electrode can be reduced.

Means for Solving the Problems

As means for achieving the above objects, a GaN-based LED element and a light emitting device will be disclosed as follows.

(1) A GaN-based LED element comprising a semiconductor laminate composed of a plurality of GaN-based semiconductor layers, the semiconductor laminate including a p-type layer, a light emitting layer arranged on the side of one surface of the p-type layer, and an n-type layer arranged so as to sandwich the light emitting layer with the p-type layer, a light-transmissive conductive oxide film being formed on the other surface of the p-type layer, and a positive pad electrode being formed on the conductive oxide film, characterized in that the conductive oxide film includes a first conductive film and a second conductive film electrically connected to the first conductive film, the part of the conductive oxide film being in contact with the p-type layer is composed of a first contact portion being a part of the first conductive film and a second contact portion being a part of the second conductive film, at least a part of the positive pad electrode is formed on the second contact part, and a current flowing from the conductive oxide film to the p-type layer runs to the p-type layer mainly through the first contact portion.

(2) A GaN-based LED element comprising a semiconductor laminate composed of a plurality of GaN-based semiconductor layers, the semiconductor laminate including a p-type layer, a light emitting layer arranged on the side of one surface of the p-type layer, and an n-type layer arranged so as to sandwich the light emitting layer with the p-type layer, a light-transmissive conductive oxide film being formed on the other surface of the p-type layer, and a positive pad electrode being formed on the conductive oxide film, characterized in that the conductive oxide film includes a first conductive film and a second conductive film electrically connected to the first conductive film, the part of the conductive oxide film being in contact with the p-type layer is composed of a first contact portion being a part of the first conductive film and a second contact portion being a part of the second conductive film, at least a part of the positive pad electrode is formed on the second contact part, and the contact resistance of the conductive oxide film with the p-type layer is lower in the first contact portion than in the second contact part.

(3) A GaN-based LED element comprising a semiconductor laminate composed of a plurality of GaN-based semiconductor layers, the semiconductor laminate including a p-type layer, a light emitting layer arranged on the side of one surface of the p-type layer, and an n-type layer arranged so as to sandwich the light emitting layer with the p-type layer, a light-transmissive conductive oxide film being formed on the other surface of the p-type layer, and a positive pad electrode being formed on the conductive oxide film, characterized in that the conductive oxide film includes a first conductive film and a second conductive film electrically connected to the first conductive film, the part of the conductive oxide film being in contact with the p-type layer is composed of a first contact portion being a part of the first conductive film and a second contact portion being a part of the second conductive film, at least a part of the positive pad electrode is formed on the second contact part, the contact between the first contact portion and the p-type layer is ohmic, and the contact between the second contact portion and the p-type layer is non-ohmic.

(4) A GaN-based LED element comprising a semiconductor laminate composed of a plurality of GaN-based semiconductor layers, the semiconductor laminate including a p-type layer, a light emitting layer arranged on the side of one surface of the p-type layer, and an n-type layer arranged so as to sandwich the light emitting layer with the p-type layer, a light-transmissive conductive oxide film being formed on the other surface of the p-type layer, and a positive pad electrode being formed on the conductive oxide film, characterized in that the conductive oxide film includes a first conductive film and a second conductive film electrically connected to the first conductive film, the part of the conductive oxide film being in contact with the p-type layer is composed of a first contact portion being a part of the first conductive film and a second contact portion being a part of the second conductive film, at least a part of the positive pad electrode is formed on the second contact part, the first conductive film is formed by an evaporation method, laser ablation method, or sol-gel method, and the second conductive film is formed by a sputtering method.

(5) The GaN-based LED element according to any one of the above (1) to (4), wherein the first conductive film has a part sandwiched between the p-type layer and the second conductive film.

(6) The GaN-based LED element according to above (5), wherein the shape and the size of the positive pad electrode conform to the shape and the size of the second conductive film when the GaN-based LED element is planarly viewed.

(7) The GaN-based LED element according to any one of the above (1) to (4), wherein a part of the positive pad electrode occupying not less than 25% of its area is formed on the second contact portion.

(8) The GaN-based LED element according to the above (7), wherein the whole of the positive pad electrode is formed on the second contact portion.

(9) The GaN-based LED element according to any one of the above (1) to (4), wherein the positive pad electrode is composed of a body part used for bonding to a material used for making connection to an external electrode, and a protrusion part projecting from the body part, and at least the whole of the body part of the positive pad electrode is formed on the second contact portion.

(10) The GaN-based LED element according to any one of the above (1) to (4), wherein the element has unevenness artificially formed in the surface of the conductive oxide film in a region not covered with the positive pad electrode.

(11) The GaN-based LED element according to the above (10), wherein the conductive oxide film has a multilayer structure part composed of a plurality of films including the first conductive film on the interface between the first contact portion and the p-type layer, and the unevenness is formed in the surface of the multilayer structure part.

(12) The GaN-based LED element according to the above (11), wherein the multilayer structure part includes the second conductive film.

(13) The GaN-based LED element according to any one of the above (1) to (12), wherein the conductive oxide film is made of an oxide containing at least one element selected from Zn, In, Sn, and Mg.

(14) The GaN-based LED element according to any one of the above (1) to (4) having a negative electrode formed on the n-type layer and arranged on the same side as the positive pad electrode, wherein the conductive oxide film has a high sheet resistance part formed on the interface between the first contact portion and the p-type layer, and a low sheet-resistance part having sheet resistance relatively lower than that of the high sheet resistance part, and when the GaN-based LED element is planarly viewed, the low sheet resistance part and the negative electrode are apart from each other at substantially the same interval across the high sheet resistance part, and the positive pad electrode is in contact with the conductive oxide film on the low sheet resistance part side of a boundary between the high sheet resistance part and the low sheet resistance part.

(15) The GaN-based LED element according to any one of the above (1) to (4) having a negative electrode formed on the n-type layer and arranged on the same side as the positive pad electrode, wherein the conductive oxide film has a high sheet resistance part formed on the interface between the first contact portion and the p-type layer, and a low sheet resistance part having sheet resistance relatively lower than that of the high sheet resistance part, and when the GaN-based LED element is planarly viewed, the low sheet resistance part and the negative electrode are apart from each other at substantially the same interval across the high sheet resistance part, and the positive pad electrode is connected to the conductive oxide film so that a current supplied from the positive pad electrode flows to the high sheet resistance part through the low sheet resistance part.

(16) The GaN-based LED element according to the above (14) or (15), wherein the high sheet resistance part is formed of the first conductive film only, and the low sheet resistance part has a multilayer structure including the first conductive film and the second conductive film.

(17) The GaN-based LED element according to the above (14) or (15), wherein the high sheet resistance part has a dot-shape convex part artificially formed on the surface of the first conductive film and made of a conductive oxide material.

(18) The GaN-based LED element according to any one of the above (1) to (17), wherein the positive pad electrode has a reflection layer made of Al, Ag, or platinum group element as a main component.

(19) A light emitting device wherein the GaN-based LED element according to any one of the above (1) to (18) is flip-chip mounted.

Effect of the Invention

Since the GaN-based LED element according to an embodiment of the present invention is superior in light emission output, it can be suitably used for purposes requiring high output power such as an illumination purpose.

BRIEF DESCRIPTION OF DRAWINGS

FIG. 1 shows views of a structure of a GaN-based LED element according to an embodiment of the present invention, wherein FIG. 1(a) is a plan view and FIG. 1(b) is a cross-sectional view taken along line X-X in FIG. 1(a).

FIG. 2 shows views of a structure of a GaN-based LED element according to an embodiment of the present invention, wherein FIG. 2(a) is a plan view and FIG. 2(b) is a cross-sectional view taken along line X-X in FIG. 2(a).

FIG. 7 shows views of a structure of a GaN-based LED element according to an embodiment of the present invention, wherein FIG. 7(a) is a plan view and FIG. 7(b) is a cross-sectional view taken along line X-X in FIG. 7(a).

FIG. 8 shows views of a structure of a GaN-based LED element according to an embodiment of the present invention, wherein FIG. 8(a) is a plan view and FIG. 8(b) is a cross-sectional view taken along line X-X in FIG. 8(a).

FIG. 18 shows views of a structure of a GaN-based LED element according to an embodiment of the present invention, wherein FIG. 18(a) is a plan view and FIG. 18(b) is a cross-sectional view taken along line X-X in FIG. 18(a).

Figure 1:
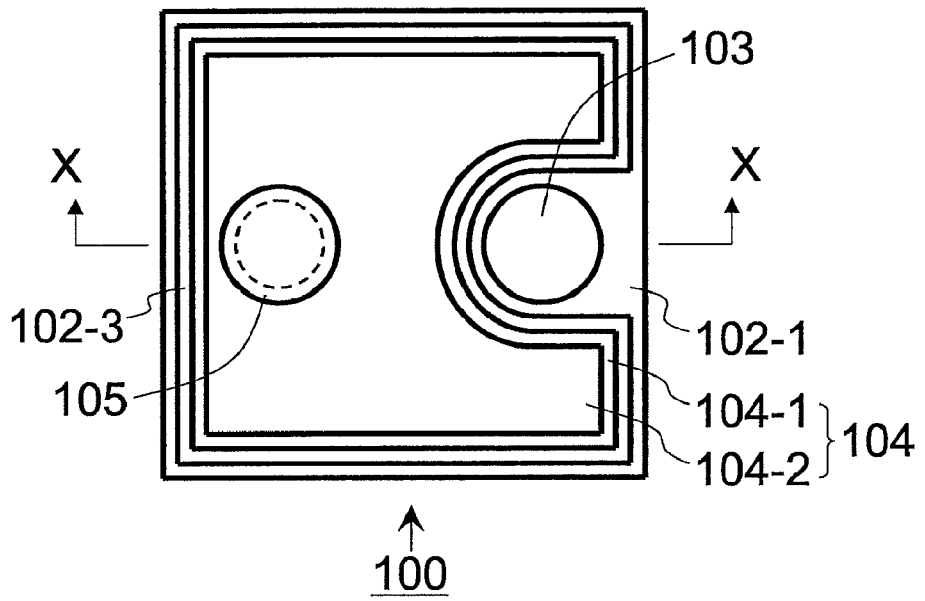
Figure 1:
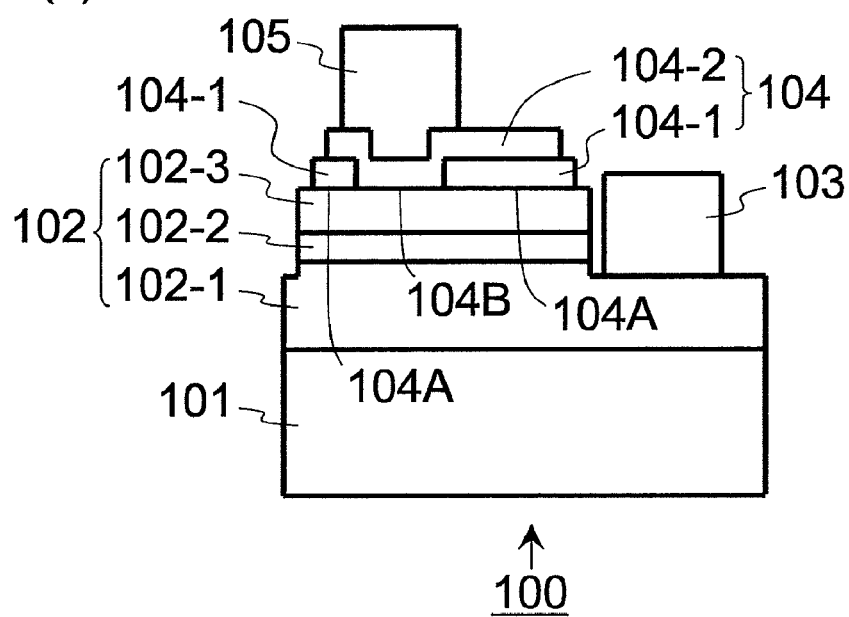

EXPLANATION OF SYMBOLS 100, 200 GaN-based LED element
101, 201 substrate
102, 202 semiconductor laminate
102-1 n-type layer
102-2 light emitting layer
102-3 p-type layer
103, 203 negative electrode
104, 204 conductive oxide film
104-1, 204-1 first conductive oxide film (first conductive film)
104A, 204A first contact portion
104-2, 204-2 second conductive oxide film (second conductive film)
104B, 204B second contact portion
105, 205 positive pad electrode

BEST MODE FOR CARRYING OUT THE INVENTION

In the following description of the present invention, when it is said that a member of a GaN-based LED element is light-transmissive or has light-transmissive properties, it means that the member shows transmissivity to the light emitted from the light emitting layer when applying current to the GaN-based LED element.

FIG. 1 shows a structure example of a GaN-based LED element according to a preferable embodiment of the present invention. FIG. 1(a) is a plan view of the LED element taken from the side on which a laminate of GaN-based semiconductor layers is formed, and FIG. 1(b) is a cross-sectional view taken along line X-X in FIG. 1(a).

A GaN-based LED element 100 shown in FIG. 1 has a substrate 101, and a semiconductor laminate 102 composed of a plurality of GaN-based semiconductor layers formed thereon as shown in the cross-sectional view in FIG. 1(b). The semiconductor laminate 102 includes an n-type layer 102-1, a light emitting layer 102-2, and a p-type layer 102-3 formed in this order from the substrate 101 side. A negative electrode 103 serving as an ohmic electrode and also as a pad electrode is formed on a partially exposed surface of the n-type layer 102-1. A light-transmissive conductive oxide film 104 is formed on the p-type layer 102-3, and a positive pad electrode 105 is formed on the conductive oxide film. The conductive oxide film 104 is composed of a first conductive oxide film ("first conductive film") 104-1, and a second conductive oxide film ("second conductive film") 104-2. The first conductive film 104-1 is formed so as to cover almost the whole surface of the p-type layer 102-3, and the second conductive film 104-2 is formed thereon. The positive pad electrode 105 is formed on the surface of the second conductive film 104-2. A part of the first conductive film 104-1 is removed in the form of circle just under the positive pad electrode 105, where the second conductive film 104-2 is in contact with the surface of the p-type layer 102-3. In FIG. 1(a), the region where the first conductive film 104-1 is partially removed is shown by a broken line (the region surrounded by the broken line is the region where the first conductive film 104-1 is removed). Therefore, it is possible to say that the conductive oxide film 104 has, in the part being in contact with the p-type layer 102-3, a portion 104A being a part the first conductive film 104-1 ("first contact portion") and a portion 104B being a part of the second conductive film 104-2 ("second contact portion"). Such part of the positive pad electrode 105 that contains its central region and that occupies not less than 50% of its area is formed on the second contact portion 104B.

In the GaN-based LED element 100, the first conductive film 104-1 is electrically connected to the positive pad electrode 105 via the second conductive film 104-2. The contact resistance between the conductive oxide film 104 and the p-type layer 102-3 in the first contact portion 104A is made to be lower than that in the second contact portion 104B, and accordingly a current to be supplied from the positive pad electrode 105 to the p-type layer 102-3 via the conductive oxide film 104 flows to the p-type layer 102-3 mainly through the first contact portion 104A. Preferably, while the contact between the first conductive film 104-1 and the p-type layer 102-3 is made ohmic, the contact between the second conductive film 104-2 and the p-type layer 102-3 is made non-ohmic, so that almost all the current to be supplied from the conductive oxide film 104 to the p-type layer 102-3 flows to the p-type layer 102-3 through the first contact portion 104A.

It is known that the contact resistance between a p-type GaN based semiconductor and a conductive oxide film formed thereon varies depending on the method for forming the conductive oxide film. For example, it is known that with respect to ITO (indium tin oxide), tin oxide, indium oxide, zinc oxide or the like, a film formed by a vacuum deposition method, laser ablation method, or sol-gel method shows contact resistance lower than that formed by a sputtering method (patent document 2). Therefore, according to an embodiment, the first conductive film 104-1 and the second conductive film 104-2 can be formed by different methods in order to make the contact resistance of the conductive oxide film 104 with the p-type layer 102-3 in the first contact portion 104A lower than that in the second contact portion 104B. For example, the first conductive film 104-1 is formed by a vacuum deposition method, laser ablation method, or sol-gel method, and the second conductive film 104-2 is formed by a sputtering method. Preferably, since a dry film formation method is easier in controlling a film quality and a process, the first conductive film 104-1 is formed by a vacuum deposition method or laser ablation method, and the second conductive film 104-2 is formed by a sputtering method.

In addition, it is known that the contact resistance between a p-type GaN based semiconductor and a conductive oxide film formed thereon becomes low as a carrier concentration of the conductive oxide film (carrier concentration in the part being in contact with the p-type GaN base semiconductor) is increased. The method for controlling a carrier concentration of a conductive oxide film is well-known. In the case of ITO (indium tin oxide), for example, the carrier concentration can be controlled based on an In (indium) concentration and an oxygen concentration. Therefore, in the case of film formation by an evaporation method, the ITO films having different carrier concentrations can be formed by varying a composition of evaporation material and an oxygen partial pressure during the deposition. In addition, it is also known that in the case of ITO, the carrier concentration of the film formed by a vacuum deposition method is higher than that formed by a spray pyrolysis method. Furthermore, it is known that films having different carrier concentrations can be formed by controlling an adding amount of an impurity such as Sb (antimony), F (fluorine), or P (phosphorous) in the case of tin oxide, and by controlling an adding amount of an impurity such as Ga (gallium) in the case of zinc oxide. Thus, in an embodiment, the carrier concentration of the first conductive film 104-1 can be made higher than that of the second conductive film 104-2 in order to make the contact resistance of the conductive oxide film 104 with the p-type layer 102-3 lower in the first contact portion 104A than in the second contact portion 104B.

In an embodiment, the surface of the p-type layer 102-3 to be in contact with the second contact portion 104B may be subject to a plasma treatment such that the contact resistance of the conductive oxide film 104 with the p-type layer 102-3 is lower in the first contact portion 104A than in the second contact portion 104B. This plasma treatment includes a dry etching treatment using a halogen-containing gas ($Cl_2$, $SiCl_4$, or $BCl_3$, for example). It is known that while some electrodes give low contact resistance when formed on the surface of a p-type GaN based semiconductor from which only a natural oxide film is removed, they give high contact resistance when formed on the surface of a p-type GaN-based semiconductor treated by dry etching. This is because the surface of a p-type GaN-based semiconductor treated by dry etching becomes non-ohmic, or becomes highly resistive. In addition, the above plasma treatment may an exposure to the plasma made from a gas not having highly corrosive properties (Ar, $H_2$ and the like). It is known that while some electrodes give low contact resistance when formed on the surface of a p-type GaN-based semiconductor from which only a natural oxide film is removed, they give high contact resistance when formed on the surface of a p-type GaN-based semiconductor which has been exposed to such plasma beyond the extent of natural oxide film removal. It is said this is because the highly resistive surface layer is formed due to a physical damage to the crystal structure. The above plasma treatment can be performed in a general RIE (reactive ion etching) device or a plasma etching device.

In an embodiment, the surface of the p-type layer 102-3 to be in contact with the second contact portion 104B may be made highly resistive using a phenomenon called hydrogen passivation in order for the contact resistance of the conductive oxide film 104 with the p-type layer 102-3 to be lower in the first contact portion 104A than in the second contact portion 104B. In this method, Mg (magnesium) is added to the p-type layer 102-3 as a p-type impurity, and Mg is activated by an annealing treatment and the like before the conductive oxide film 104 is formed in order to make the p-type layer 102-3 low in resistance. In a step for forming the conductive oxide film 104, the first conductive film 104-1 is formed into a predetermined pattern on the p-type layer 102-3. Then, a hydrogen gas or an ammonia gas is brought in contact with the surface of the p-type layer 102-3 that will be in contact with the second conductive film 104-2. In this step, under the condition that the surface of the p-type layer 102-3 is in contact with the hydrogen gas or the ammonium gas, the wafer is heated to 400° C. or more, and cooled to 400° C. or less again. By this treatment, a highly resistive layer where Mg is inactivated by hydrogen is formed on the exposed surface of the p-type layer 102-3. After that, the second conductive film 104-2 is formed, whereby the contact resistance of the conductive oxide film 104 with the p-type layer 102-3 can be lower in the first contact portion 104A than in the second contact portion 104B.

In a preferable embodiment, the first conductive film 104-1 and the second conductive film 104-2 are formed in order for the difference in thermal expansion coefficient between the two films to be small. In order to achieve this, for example, it is effective to form the two films from conductive oxide materials having the same or similar composition. By doing so, when the LED element is put in a high-temperature environment during the production process of the light emitting device or at the time of use, the peeling off due to thermal stress between the conductive oxide film and the p-type layer or between the two conductive oxide films can be prevented.

In order to constitute a light emitting device, the GaN-based LED element 100 is fixed to a mounting surface provided in a member such as a ceramic package, resin package, slag, lead frame, and unit substrate, directly or via a submount. In a mounting form called a face-up mounting, the LED element 100 is fixed with the back surface of the substrate 101 (the surface where the semiconductor laminate 102 is not formed) facing the mounting surface. With few exceptions (the case where a specific package is used), when the face-up mounting is employed, the semiconductor laminate 102 side of the LED element 100 faces the light extraction direction of the light emitting device. On the other hand, in a mounting form called a face-down mounting, the LED element 100 is fixed with the semiconductor laminate 102 side facing the mounting surface. The face-down mounting is also called flip-chip mounting. When this mounting form is employed, the substrate 101 side of the LED element 100 faces the light extraction direction of the light emitting device in many cases. Therefore, the face-down mounting is generally used when the substrate 101 is a light-transmissive substrate.

In the GaN-based LED element 100, a current is supplied from the positive pad electrode 105 to the p-type layer 102-3 mostly through the first contact portion 104A of the conductive oxide film 104. Therefore, the light generation is suppressed beneath the positive pad electrode 105. The light generated beneath the positive pad electrode 105 is to be strongly absorbed by the positive pad electrode. In the GaN-based LED element 100, by previously suppressing the light generation (by cutting a current consumed in generating this light), loss is reduced and the light emission output power is improved. Particularly when the GaN-based LED element 100 is flip-chip mounted, a remarkable effect of increasing the output power is achieved by previously suppressing the generation of the light that tends to be absorbed by the positive pad electrode.

In the light emitting device in which the semiconductor laminate 102 side of the GaN-based LED element 100 faces the light extraction direction (generally, the light emitting device in which the GaN-based LED element 100 is face-up mounted), it is clear that the output power improving effect can be achieved by suppressing the light generation just under the positive pad electrode 105. In such light emitting device, since the light generated just under the positive pad electrode 105 is not only absorbed by the positive pad electrode but also shielded thereby, the light cannot be efficiently extracted in the light extraction direction. Therefore, the loss reduction effect is definitely seen by previously suppressing the generation of such light.

In the GaN-based LED element 100, since the positive pad electrode 105 and the p-type layer 102-3 are not in contact with each other, it is advantageous that the light generated in the light emitting layer 102-2 and then propagated in a layer direction in the semiconductor laminate 102 is difficult to be absorbed by the positive pad electrode 105. The improvement effect of the light emission output power provided by the above advantage becomes more remarkable as the thickness of the second conductive film 104-2 is increased. Therefore, in the GaN-based LED element 100, the thickness of is the second conductive film 104-2 is preferably not less than 0.05 µm, more preferably not less than 0.1 µn, and still more preferably not less than 0.2 µm. Meanwhile, when the thickness of the second conductive film 104-2 is increased too much, the light is problematically absorbed by the second conductive film 104-2, and thus, the thickness of the second conductive film 104-2 is preferably not more than 1 µm, more preferably not more than 0.5 µm, and still more preferably not more than 0.3 µm.

Figure 2:
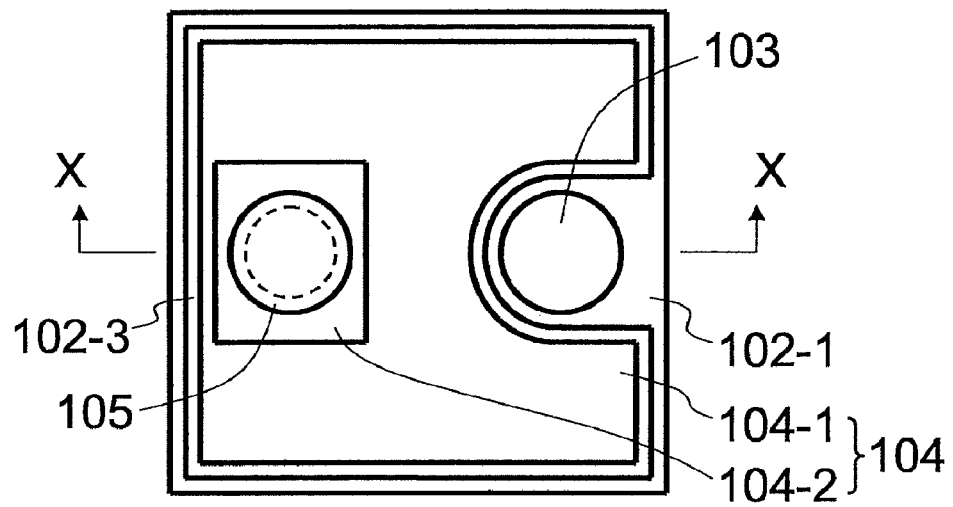
Figure 2:
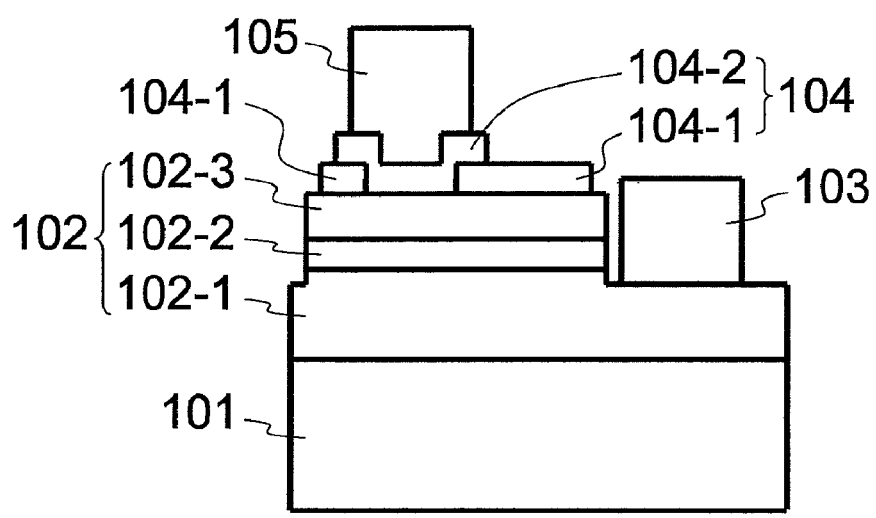

In order to alleviate the problem of the light absorption by the second conductive film, the area of the second conductive film 104-2 may be reduced as shown in FIG. 2. Here, FIG. 2(a) is a plan view of the GaN-based LED element, and FIG. 2(b) is a cross-sectional view taken along line X-X in FIG. 2(a). In an example shown in FIG. 2, the area of the second conductive film 104-2 may be further reduced to conform the shape and the size of the second conductive film 104-2 to the shape and the size of the positive pad electrode 105 when the LED element is planarly viewed.

Figure 3:
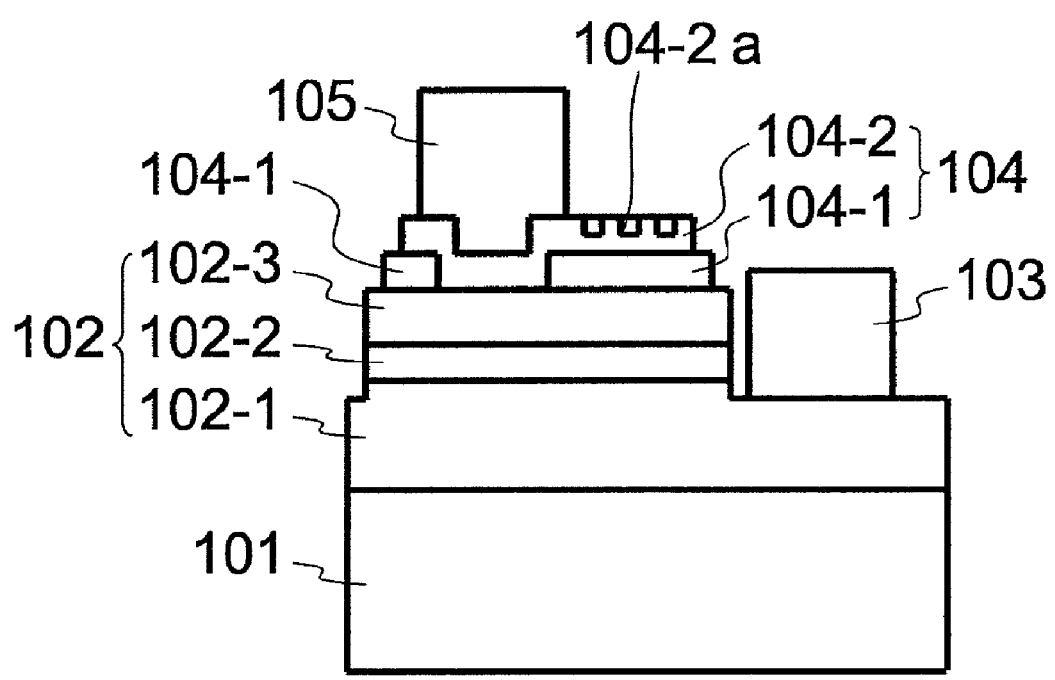
FIG. 3 is a cross-sectional view showing a structure of a GaN-based LED element according to an embodiment of the present invention.
Figure 4:
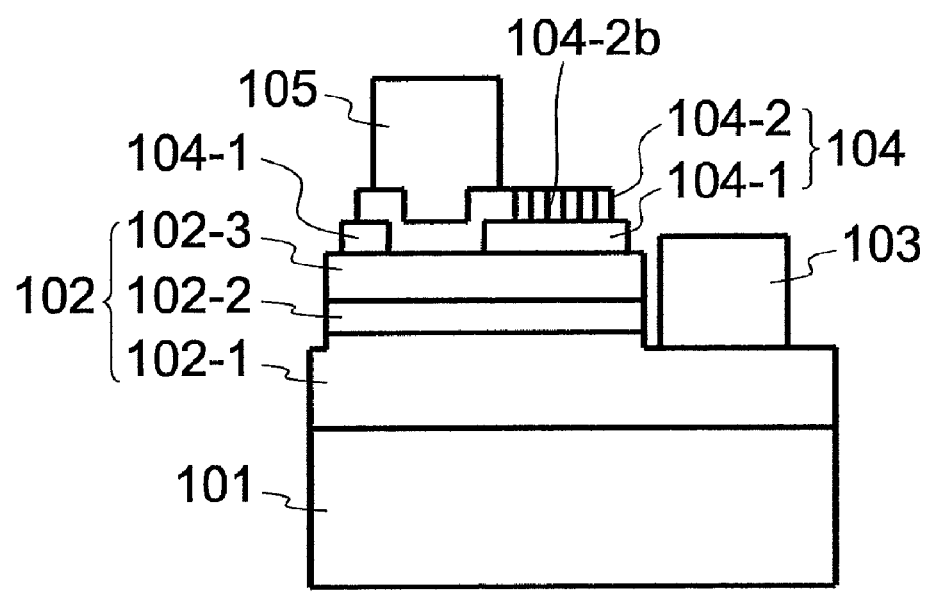
FIG. 4 is a cross-sectional view showing a structure of a GaN-based LED element according to an embodiment of the present invention.

In order to prevent the light from being absorbed by the second conductive film 104-2, the film thickness of the second conductive film 104-2 may be partially reduced as shown in FIG. 3 or 4. In an example shown in FIG. 3, a plurality of concave parts 104-2a are provided in the surface of the second conductive film 104-2. In an example shown in FIG. 4, a plurality of through holes 104-2b are provided in the second conductive film 104-2. The concave parts 104-2a and the through holes 104-2b can be formed by partially removing the second conductive film by dry etching such as RIE (reactive ion etching), or wet etching after the second conductive film 104-2 has been formed. Alternatively, the second conductive film 104-2 can be made into a pattern having the through holes 104-2b from the beginning by a liftoff method. When setting the depth of the concave parts or the through hole formed in the second conductive film 104-2 to be about the same as or greater than the wavelength of the light emitted from the light emitting layer 102-2 (wavelength in the LED element 100), diffused reflection of the light occurs at the concave parts or the through holes, whereby the effect of improving the light extraction efficiency can be expected.

Figure 5:
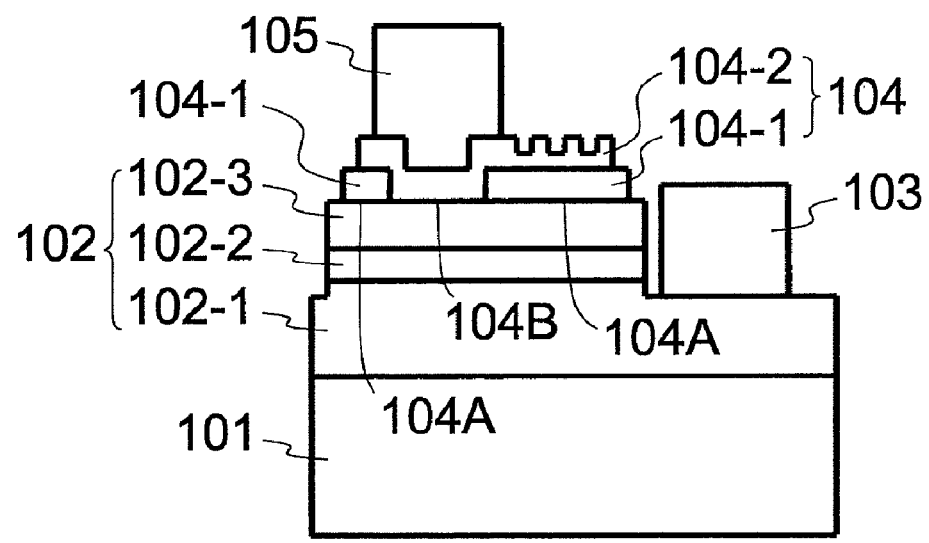
FIG. 5 is a cross-sectional view showing a structure of a GaN-based LED element according to an embodiment of the present invention.

In order to improve the light extraction efficiency of the GaN-based LED element 100, unevenness may be artificially formed in the surface of the conductive oxide film 104 in the region where it is not covered with the positive pad electrode 105 as shown in FIG. 5. Here, the artificially formed unevenness is formed by a processing technique and is distinguished from that which is spontaneously formed in the surface of a polycrystalline thin film as seen in ITO film and the like. Both an artificially formed unevenness and a spontaneously formed unevenness may exist in the surface of the conductive oxide film 104.

As a pattern of the unevenness formed artificially in the surface of the conductive oxide film 104, a pattern comprising dispersed dot-shaped convex parts (projections), a pattern comprising dispersed dot-shaped concave parts (depressions), a pattern comprising alternately arranged stripe-shaped concave parts (grooves) and stripe-shaped convex parts (ridges), and the like are preferably exemplified. In order to diffusely reflect the light emitted from the light emitting layer 102-2 by the unevenness, a difference in height between the concave part and the convex part in the unevenness is made to be the same as or greater than the wavelength of the light in the conductive oxide film 104. For example, when the wavelength of the light emitted from the light emitting layer 102-2 is 400 nm in the air, and the refractive index of the conductive oxide film 104 is about 1.8, the wavelength of the said light as is about 220 nm in the conductive oxide film, so that the difference in height of the concave part and the convex part is made to be greater than 110 nm which is half as long. In addition, a distance between the adjacent convex parts or a distance between the adjacent concave parts may be from 0.1 µm to 20 µm, for example.

An unevenness can be artificially formed in the surface of the conductive oxide film 104 by forming an etching mask partially covering the surface, and then performing etching to form the concave parts. The etching mask includes a random etching mask made of randomly deposited metal or polymer fine particles, and a photoresist film patterned by using a photolithography technique. Fine-particle deposition produced with a dry etching device operated in a deposition mode can be used as a random etching mask. The etching may be dry etching (RIE, or plasma etching), or wet etching. In an example shown in FIG. 5, although the bottom of the concave parts formed in the surface of the conductive oxide film 104 (surface of the second conductive film 104-2) does not reach the first conductive film 104-1, it is not limiting, and the etching may be performed until the first conductive film 104-1 is exposed at the bottom of the concave part. Preferably, the etching is not performed until the p-type layer 102-3 is exposed at the bottom of the concave part. When the etching is performed until the p-type layer 102-3 is exposed, the current supply from the conductive oxide film 104 to the p-type layer 102-3 is inhibited and as a result, the light emission is inhibited.

Figure 6:
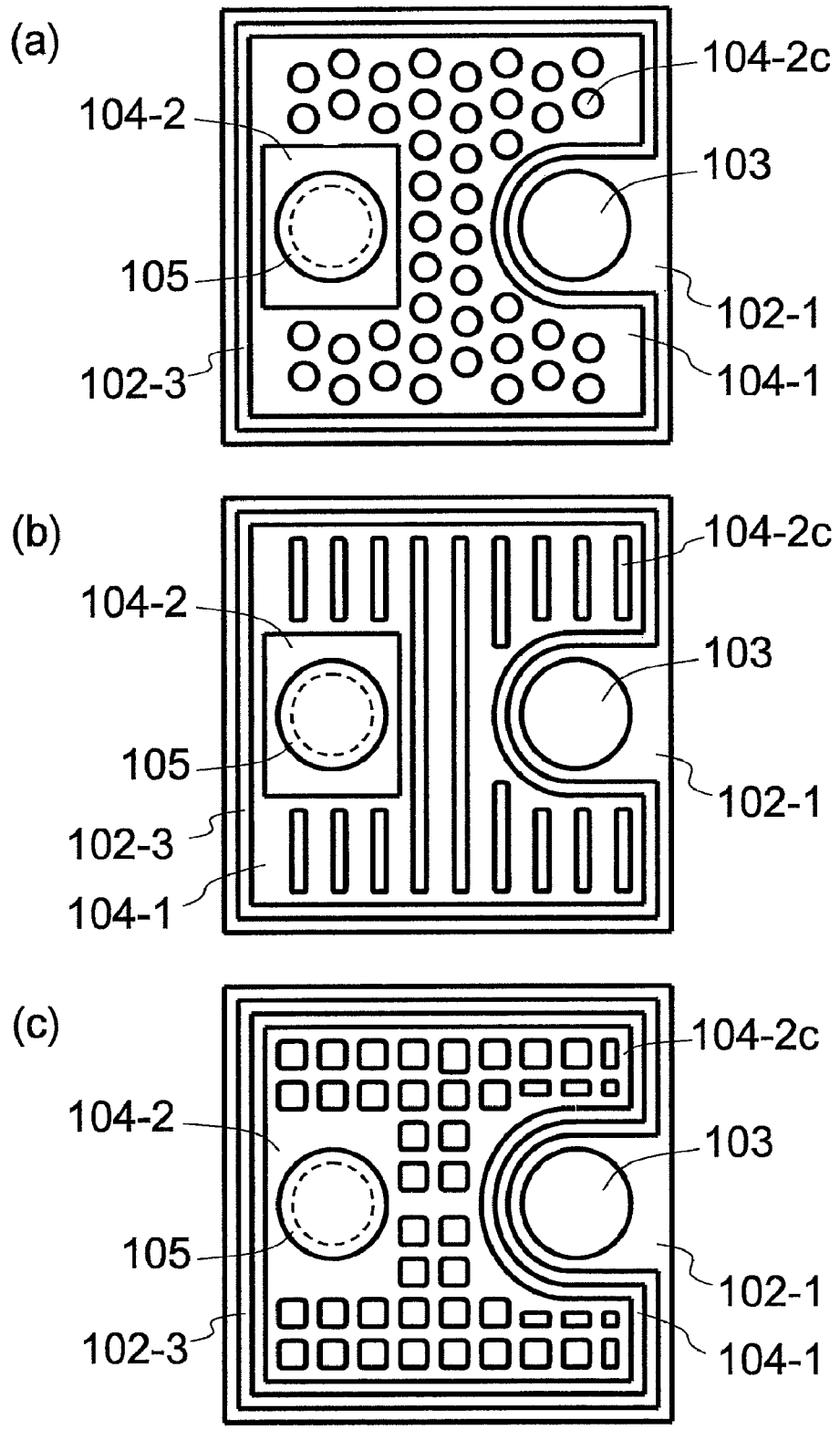
FIG. 6 is a plan view showing a structure of a GaN-based LED element according to an embodiment of the present invention.

In another method for artificially forming an unevenness in the surface of the conductive oxide film 104, by using a liftoff method, a part of the second conductive film 104-2 formed on the first conductive film 104-1 is made into a pattern such as dot-shaped, stripe-shaped, or net-shaped pattern to serve as a convex part. FIG. 6 is plan views of a GaN-based LED element having a convex part formed by this method in the surface of the conductive oxide film 104. In an example shown in FIG. 6(*a*), the part 104-2*c* of the second conductive film serving as a convex part is shaped into a circular dot pattern. In an example shown in FIG. 6(*b*), the part 104-2*c* of the second conductive film serving as a convex part is shaped into a stripe pattern. In an example shown in FIG. 6(*c*), the part 104-2*c* of the second conductive film serving as a convex part is shaped into a net pattern. According to this method, an unevenness can be formed in the surface of the conductive oxide film 104 almost without damaging the interface between the p-type layer 102-3 and the first contact portion 104A.

Light emission occurs in a region positioned below the first contact portion 104A in the light emitting layer 102-2. In order to prevent the light from being absorbed and/or shielded by the positive pad electrode 105, it is desirable that as much part of the positive pad electrode 105 as possible is formed above the second contact portion 104B. Thus, such part of the positive pad electrode 105 that occupies preferably 25% or greater, more preferably 50% or greater, still more preferably 75% or greater of its area (area when the LED element is planarly viewed) is formed above the second contact portion 104B. Most preferably, the whole of the positive pad electrode 105 is formed above the second contact portion 104B.

The planar shapes and arrangements of the first conductive film 104-1 and second conductive film 104-2 composing the conductive oxide film 104 may be variously changed.

Figure 7:
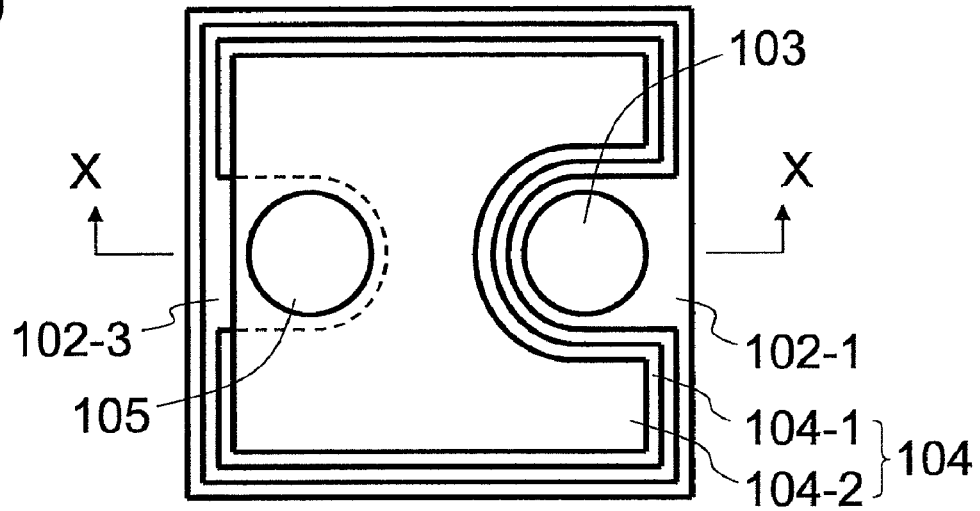
Figure 7:
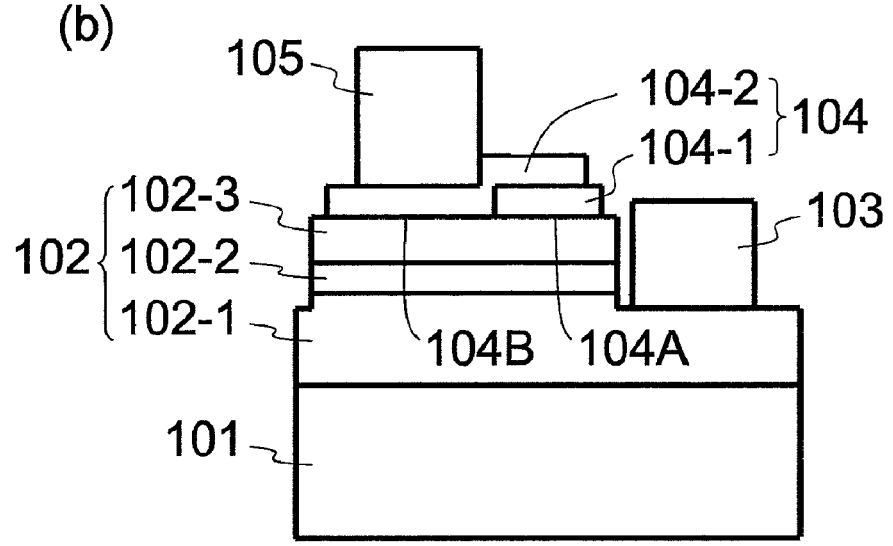

For example, as shown in FIG. 7, a notched part may be formed by removing a part of the first conductive film 104-1 formed on the p-type layer 102-3, and the positive pad electrode 105 may be formed on a region of the second conductive film 104-2 formed over the notched part. Here, FIG. 7(*a*) is a plan view of an LED element viewed from the side where the laminate of GaN-based semiconductor layers is formed, and FIG. 7(*b*) is a cross-sectional view taken along line X-X in FIG. 7(*a*). In FIG. 7(*a*), an outline of the part of the first conductive film 104-1 that is behind the second conductive film 104-2 is shown by a broken line. In the example shown in FIG. 7, the whole of the positive pad electrode 105 is formed above the second contact portion 104B of the conductive oxide film 104.

Figure 8:
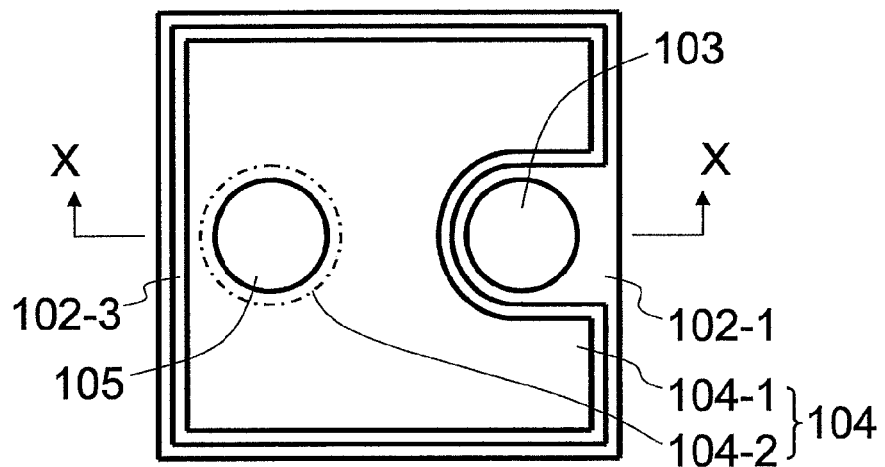
Figure 8:
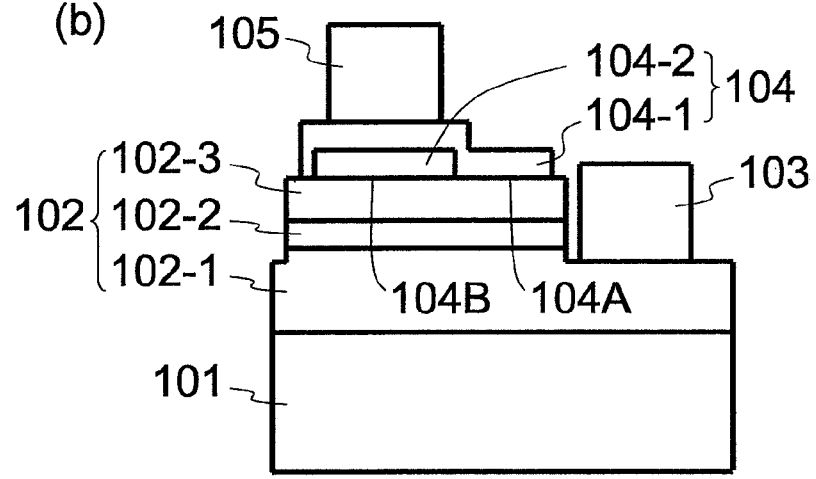

In addition, as shown in FIG. 8, the second conductive film 104-2 may be formed on the p-type layer 102-3 first and then the first conductive film 104-1 may be formed thereon. Here, FIG. 8(*a*) is a plan view of an LED element viewed from the side where the laminate of GaN-based semiconductor layers is formed, and FIG. 8(*b*) is a cross-sectional view taken along line X-X in FIG. 8(*a*). In FIG. 8(*a*), an outer peripheral line of the second conductive film 104-2 formed circularly under the first conductive film 104-1 is shown by one dot chain line. In the example shown in FIG. 8, a part sandwiched between the positive pad electrode 105 and the second conductive film 104-2 may be removed from the first conductive film 104-1. That is, as another constitution, a through hole may be provided in the first conductive film 104-1, and the positive pad electrode 105 may be in contact with the surface of the second conductive film 104-2 through the through hole. Thus, the order of the formation of the first conductive film and the second conductive film is not limited, but the first conductive film is preferably formed before the second conductive film as in the example shown in FIG. 1 and the like. It is because, when the first conductive film is formed in an early stage, the probability that the surface of the p-type layer is damaged before forming the first conductive film can be reduced. When the surface of the p-type layer is damaged, the contact resistance between the first conductive film and the p-type layer is increased. The contact resistance between the first conductive film and the p-type layer considerably affects an operation voltage (forward voltage) of the LED element.

Figure 9:
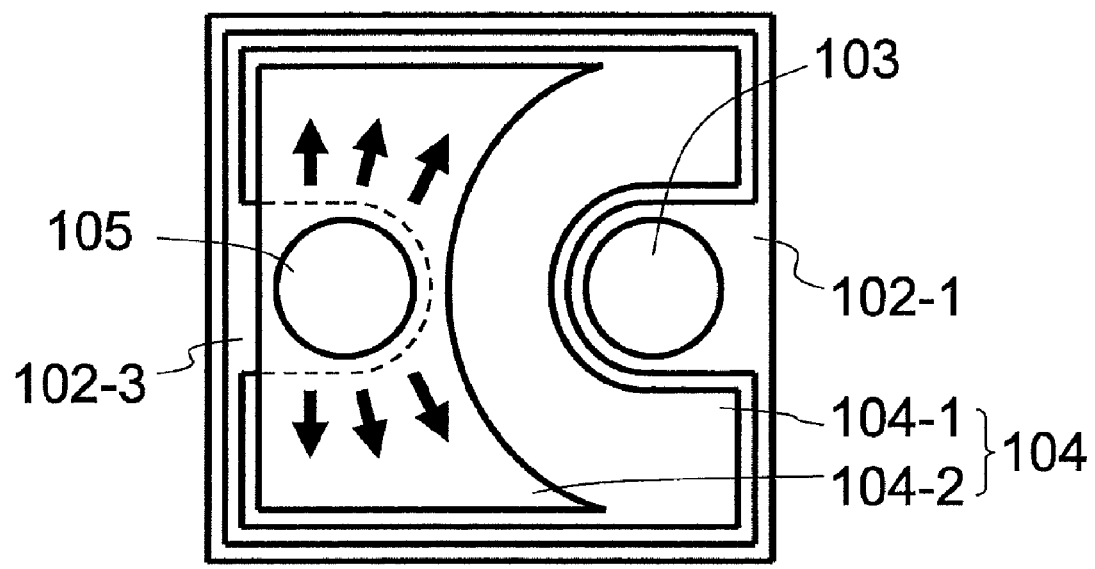
FIG. 9 is a plan view showing a structure of a GaN-based LED element according to an embodiment of the present invention.
Figure 10:
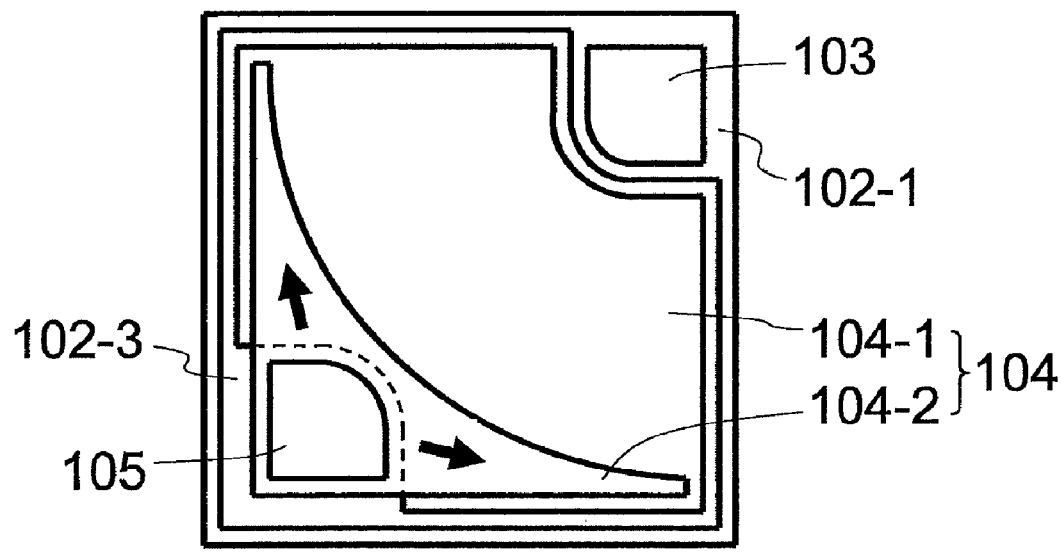
FIG. 10 is a plan view showing a structure of a GaN-based LED element according to an embodiment of the present invention.
Figure 11:
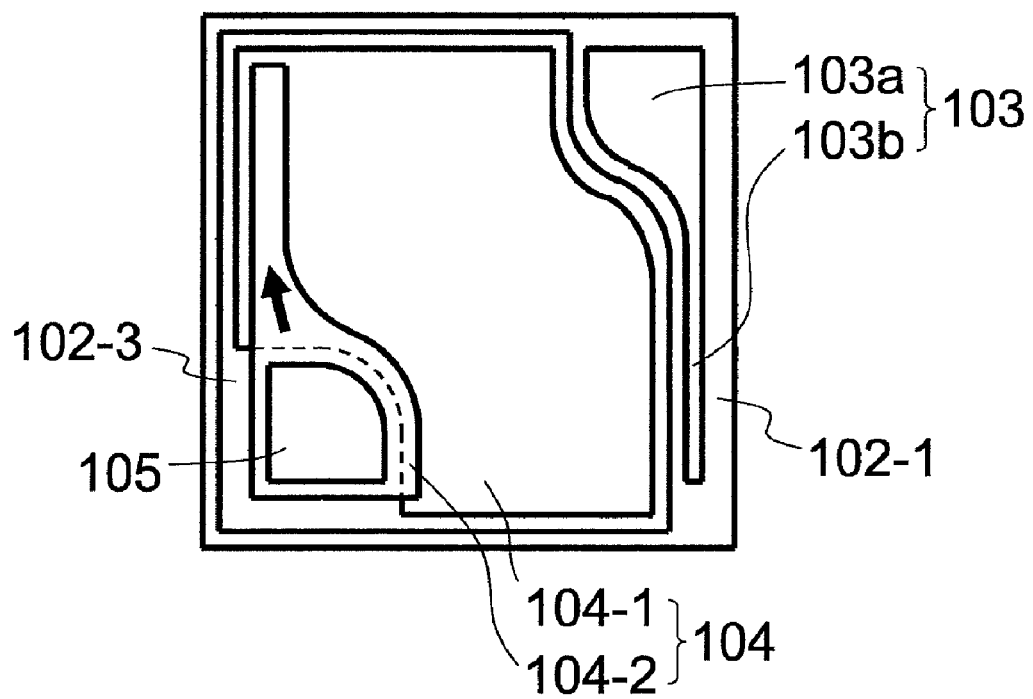
FIG. 11 is a plan view showing a structure of a GaN-based LED element according to an embodiment of the present invention.
Figure 12:
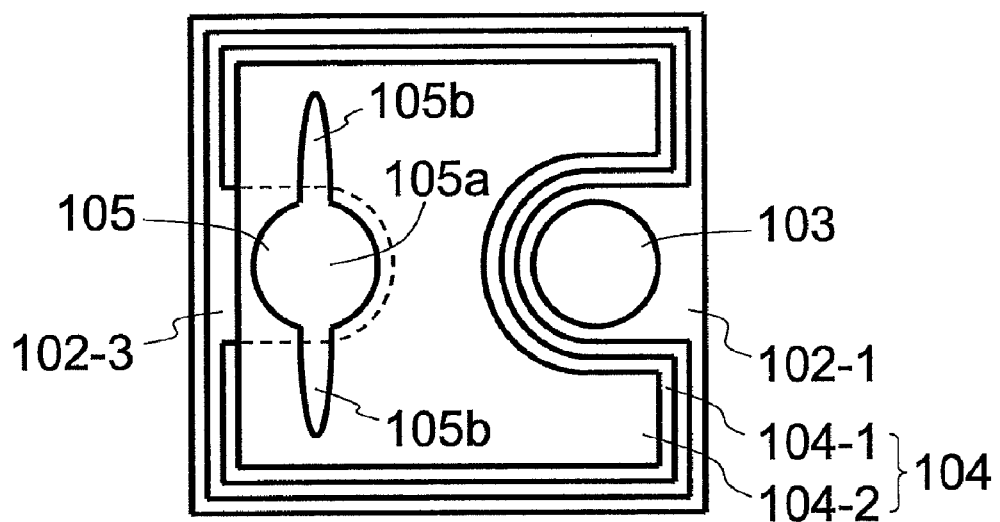
FIG. 12 is a plan view showing a structure of a GaN-based LED element according to an embodiment of the present invention.
Figure 13:
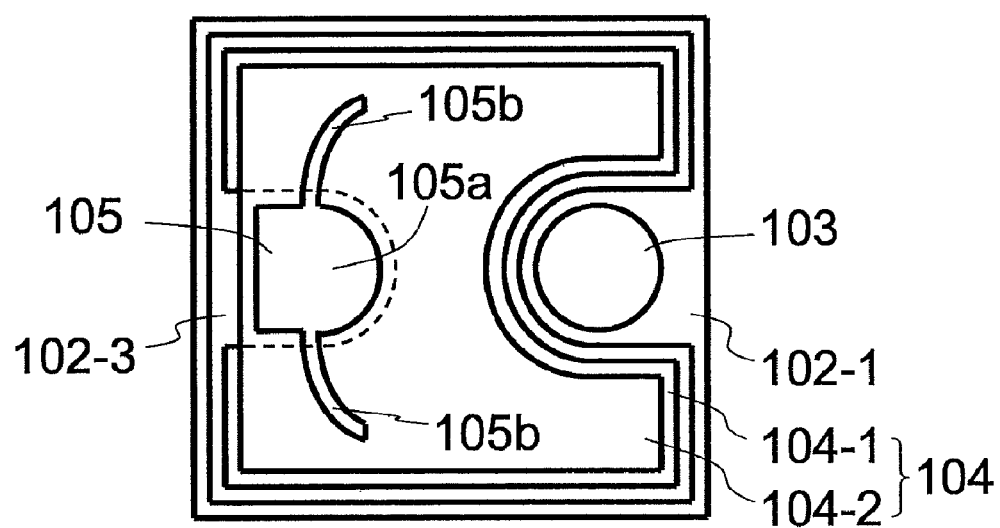
FIG. 13 is a plan view showing a structure of a GaN-based LED element according to an embodiment of the present invention.
Figure 14:
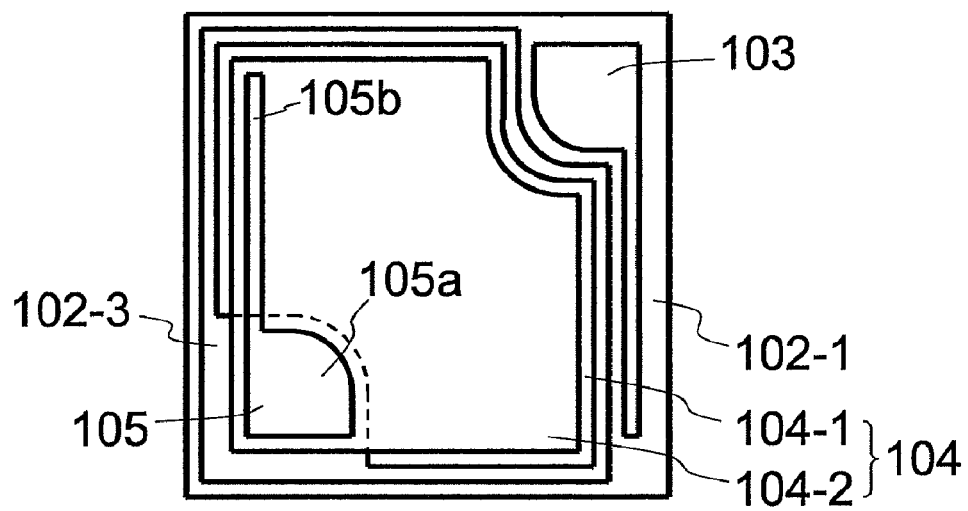
FIG. 14 is a plan view showing a structure of a GaN-based LED element according to an embodiment of the present invention.
Figure 15:
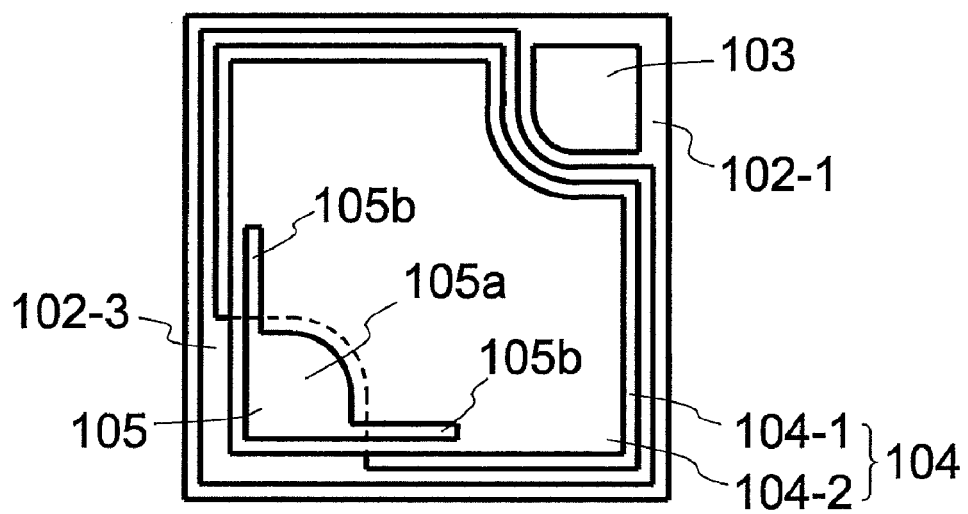
FIG. 15 is a plan view showing a structure of a GaN-based LED element according to an embodiment of the present invention.
Figure 16:
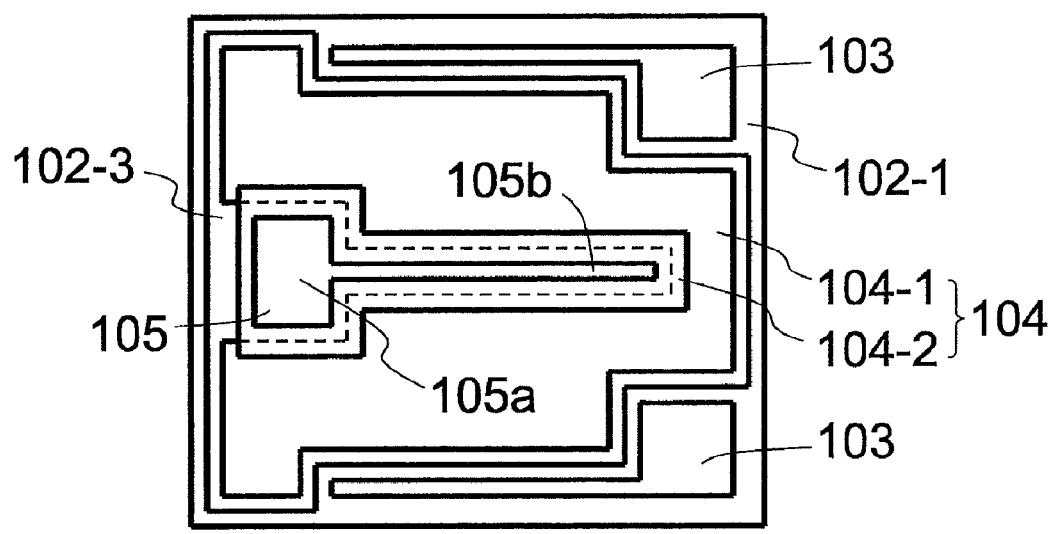
FIG. 16 is a plan view showing a structure of a GaN-based LED element according to an embodiment of the present invention.
Figure 17:
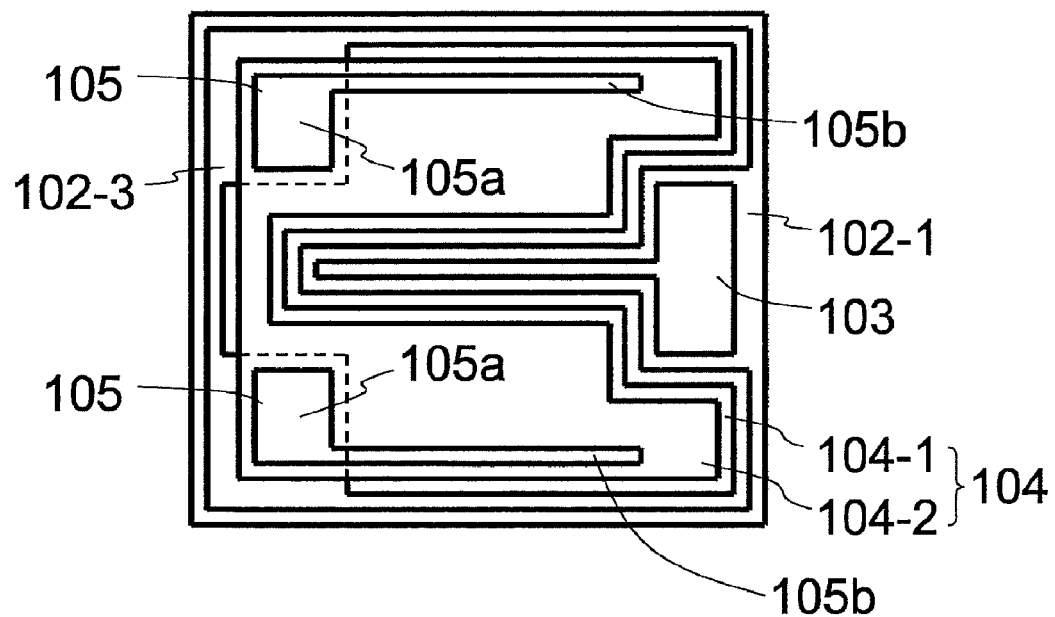
FIG. 17 is a plan view showing a structure of a GaN-based LED element according to an embodiment of the present invention.

The in-plane sheet resistance of the conductive oxide film can be changed so that a current tends to flow easily in a specific direction in the conductive oxide film. In a GaN-based LED element whose plan view is shown in FIG. 9, the conductive oxide film 104 has a multilayer part in which the first conductive film 104-1 and the second conductive film 104-2 are laminated, and a single layer part composed of the first conductive film 104-1 only. Since the film thickness of the multilayer part is larger, its sheet resistance is lower than that of the single layer part, so that the current supplied from the positive electrode 105 tends to flow easily in the conductive oxide film 104 in directions shown by arrows in the drawing. Thus, in short, the current spreads in the multilayer part and then flows into the single layer part. Further, in the GaN-based LED element shown in FIG. 9, since the multilayer part and the negative electrode 103 are apart from each other at substantially the same interval when planarly viewed, the current uniformly spreads in the in-plane direction in the single layer part of the conductive oxide film 104 placed between the multilayer part and the negative electrode 103. As a result, the light emission uniformity in the light emitting layer 102-2 can be high under this single layer part. In an example shown in FIG. 10, each of the negative electrode 103 and the positive pad electrode 105 is provided on the opposed corner parts of the rectangular LED element surface. In the conductive oxide film 104*a*, current supplied from the positive pad electrode 105 tends to flow is easily in directions shown by arrows in the drawing, that is, in extending directions of the multilayer part composed of the first conductive film 104-1 and the second conductive film 104-2. In the example shown in FIG. 10 also, the multilayer part of the conductive oxide film 104 and the negative electrode 103 are apart from each other at roughly equal interval across the single layer part. In an example shown in FIG. 11, the negative electrode 103 is composed of a body part 103*a* to which a material used for making connection to an external electrode is bonded, and a protrusion part 103*b* protruding from the body part 103*a*, and each of the body part 103*a* of the negative electrode and the positive pad electrode 105 is provided on the opposed corner parts of a rectangular LED element surface. In the conductive oxide film 104, a current supplied from the positive pad electrode 105 tends to flow easily in a direction shown by an arrow in the drawing, that is, in an extending direction of the multi-layer part composed of the first conductive film 104-1 and the second conductive film 104-2. In the example shown in FIG. 11 also, the multilayer part of the conductive oxide film 104 and the negative electrode 103 are apart from each other at roughly equal interval across the single layer part. In each example shown in FIGS. 9 to 11, in order to improve the light extraction efficiency, a dot-like convex part made of a conductive oxide material may be artificially formed in the surface of the single layer part of the conductive oxide film 104. This convex part may be provided by patterning a part of the second conductive film 104-2 into a dot-like shape. In addition, the expression of "single layer part" as used above does not limit the internal structures of the first conductive film and the second conductive film.

As shown in FIGS. 12 to 17, the positive pad electrode 105 may be composed of a body part 105a used for bonding to a bonding wire, conductive paste, brazing filler metal, or the like, and a protrusion part 105b protruding from the body part 105a. By providing the positive pad electrode 105 with the protrusion part 105b, the current can spread efficiently in the in-plane direction of the LED element. In an example in FIG. 12, the body part 105a of the positive pad electrode is circular and the two protrusion parts 105b projecting therefrom. In an example in FIG. 13, the body part 105a of the positive pad electrode is horseshoe shape (two adjacent corners in the rectangular shape are rounded), and the two protrusion parts 105b are curved. In an example shown in FIG. 14, the body part 105a of the positive pad electrode is made into a shape provided by rounding one corner of a rectangular shape and arranged at a corner part of a rectangular LED element surface, and one protrusion part 105b projects from the body part 105a. In the example shown in FIG. 14, the negative electrode 103 is also composed of a body part and a protrusion part, and the body part is arranged at a corner part of the rectangular LED element surface. In an example shown in FIG. 15, the body part 105a of the positive pad electrode is arranged at a corner part of a rectangular LED element surface, and two protrusion parts 105b project from the body part in directions perpendicular to each other. In an example shown in FIG. 16, the protrusion part 105b projects inward from the body part 105a of the rectangular positive pad electrode arranged at an edge of a rectangular LED element surface. In the example shown in FIG. 16, the first conductive film 104-1 just under the protrusion part 105b of the positive pad electrode is also removed. In an example shown in FIG. 17, two positive pad electrodes 105 each being composed of a body part 105a and a protrusion part 105b are formed.

Figure 18:
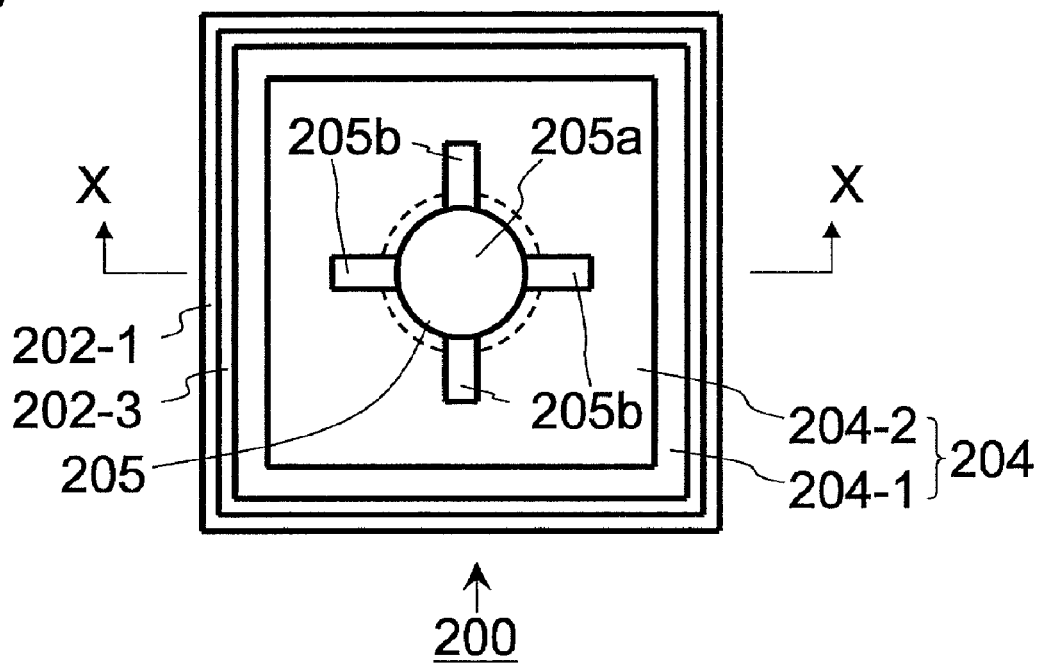
Figure 18:
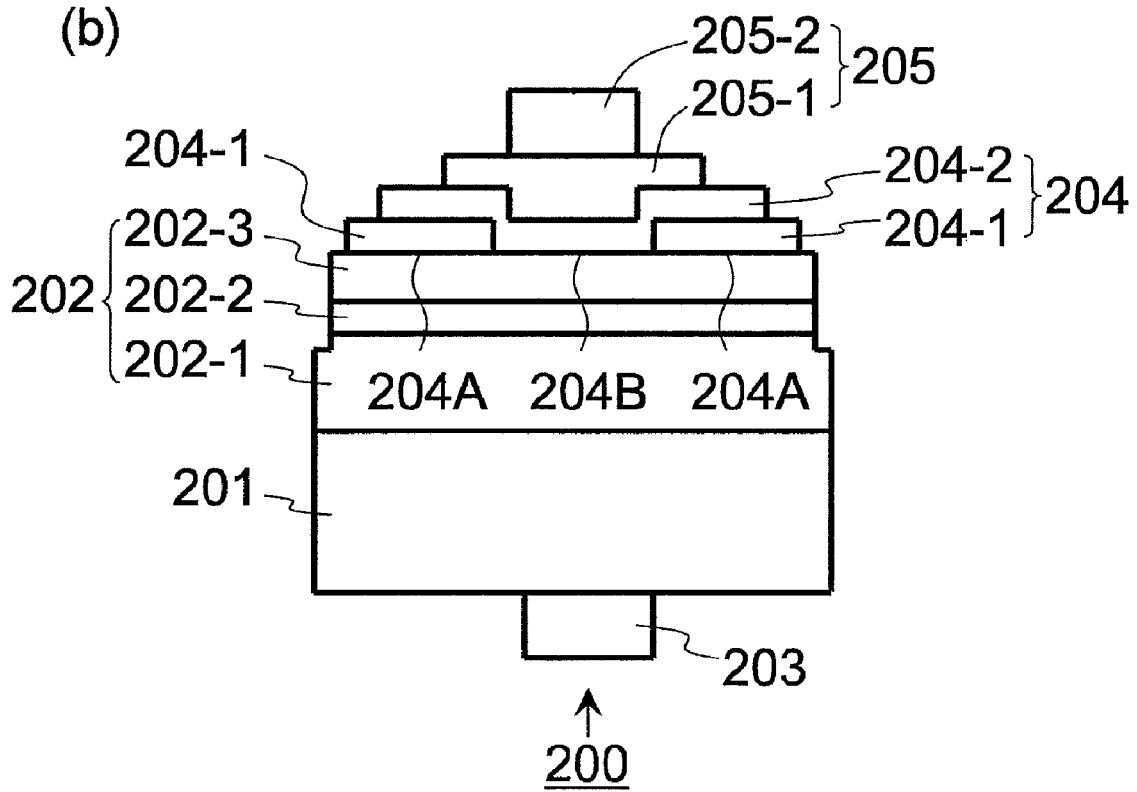
Figure 19:
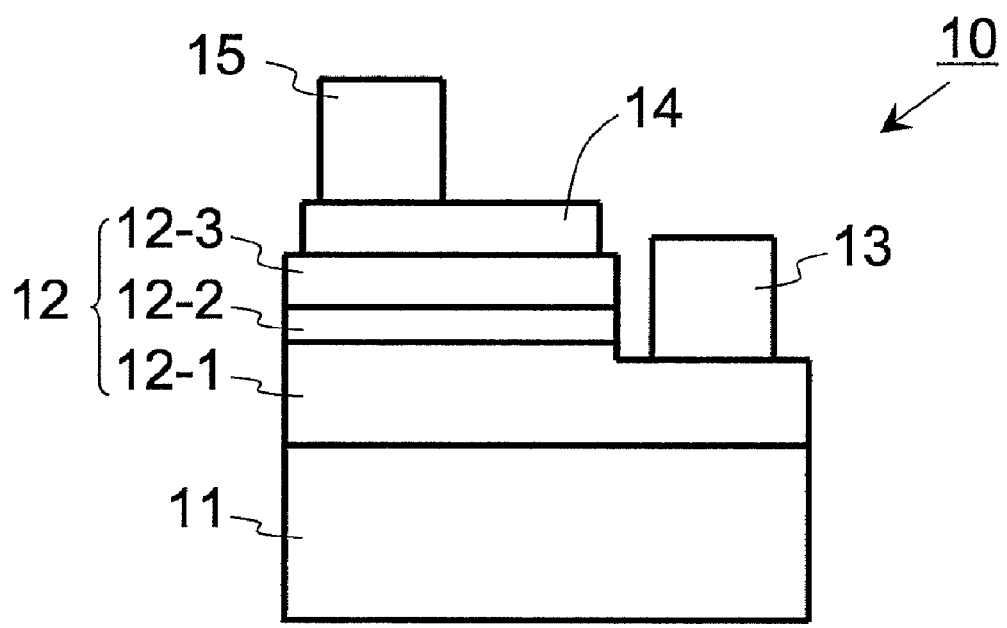
FIG. 19 is a cross-sectional view showing a structure of a conventional GaN-based LED element.

FIG. 18 shows an example of a GaN-based LED element having a conductive substrate, and FIG. 18(a) is a plan view of an LED element viewed from the side where the laminate of GaN-based semiconductor layers is formed, and FIG. 18(b) is a cross-sectional view taken along line X-X in FIG. 18(a). As shown in the cross-sectional view in FIG. 18(b), a GaN-based LED element 200 has a substrate 201, and a semiconductor laminate 202 composed of a plurality of GaN-based semiconductor layers formed thereon. The semiconductor laminate 202 includes an n-type layer 202-1, a light emitting layer 202-2, and a p-type layer 202-3 in this order from the substrate 201 side. A negative electrode 203 is formed on the back surface of the substrate 201. A light-transmissive conductive oxide film 204 is formed on the p-type layer 202-3, and a positive pad electrode 205 is formed on the conductive oxide film. The conductive oxide film 204 is composed of a first conductive oxide film ("first conductive film") 204-1, and a second conductive oxide film ("second conductive film") 204-2. The first conductive film 204-1 is formed so as to cover almost all the surface of the p-type layer 202-3, and the second conductive film 204-2 is formed thereon. The positive pad electrode 205 is formed on the second conductive film 204-2. The positive pad electrode 205 is composed of a circular body part 205a for bonding to a bonding wire, a conductive paste, a brazing filler metal, or the like, and four protrusion parts 205b projecting from the body part. As shown in FIG. 18(b), the positive pad electrode 205 has a laminated structure composed of a lower pad electrode layer 205-1 and an upper pad electrode layer 205-2, and the protrusion part 205b is provided only to the lower pad electrode layer 205-1. A circular part of the first conductive film 204-1 is removed just under the body part 205a of the positive pad electrode, and at this part, the second conductive film 204-2 is in contact with the surface of the p-type layer 202-3. In FIG. 18(a), the region partially removed from the first conductive film 204-1 is shown by a broken line (this region surrounded by the broken line is the region removed from the first conductive film 204-1). Therefore, it can be said that the conductive oxide film 204 has, in the part being in contact with the p-type layer 202-3, a portion 204A being a part of the first conductive film 204-1 ("first contact portion") and a portion 204B being a part of the second conductive film 204-2 ("second contact portion"). The contact resistance of the conductive oxide film 204 with the p-type layer 202-3 is lower in the first contact portion than in the second contact portion 204B, so that a current supplied from the positive pad electrode 205 toward the p-type layer 202-3 via the conductive oxide film 204 flows to the p-type layer 202-3 mainly through the first contact portion 204A. Therefore, in the light emitting layer 202-2, the light is mainly emitted from a region under the first contact portion 204A of the conductive oxide film 204. The positive pad electrode 205 is formed such that the whole of the body part 205a is formed above the second contact portion 204B, so that the light generated under the first contact portion 204A is difficult to be absorbed and/or shielded by the body part 205a.

While the positive pad electrode is composed of the body part 105a or 205a, and the protrusion part 105b or 205b in the examples shown in FIGS. 12 to 18, the impact of the absorption and shielding by the protrusion part on the output of the LED element is smaller than that by the body part because the protrusion part is long and thin. Therefore, as shown in the examples shown in FIGS. 12 to 15, 17, and 18, favorable effect can be achieved by only forming the whole body part 105a or 205a of the positive pad electrode above the second contact portion 104B or 204B.

Then, a production method of the GaN-based LED element 100 is described. The GaN-based LED element 100 may be produced by epitaxially growing a GaN-based semiconductor crystal on the substrate 101 by a MOVPE method (Metal-Organic Vapor Phase Epitaxy method), a MBE method (Molecular Beam Epitaxy method), or a HVPE method (Hydride Vapor Phase Epitaxy method) to form the semiconductor laminate 102. In this case, the substrate 101 is preferably a crystal substrate (single-crystal substrate or template) made of a material such as sapphire, spinel, silicon carbide, silicon, GaN-based semiconductor (GaN or AlGaN), gallium arsenide, gallium phosphide, gallium oxide, zinc oxide, LGO, NGO, LAO, zirconium boride, or titanium boride. As a light-transmissive substrate, a substrate made of a material selected from sapphire, spinel, silicon carbide, GaN-based semiconductor, gallium phosphide, gallium oxide, zinc oxide, LGO, NGO, or LAO is preferably used depending on the wavelength of the light emitted from the light emitting layer 102-2. In addition, as a conductive substrate, a substrate made of silicon carbide, silicon, GaN-based semiconductor, gallium arsenide, gallium phosphide, gallium oxide, zinc oxide, zirconium boride, or titanium boride is preferably used. When the GaN-based semiconductor crystal is epitaxially grown on the substrate 101, it is recommended to use a buffer layer technique. As a preferable buffer layer, a low-temperature buffer layer and a high-temperature buffer layer made of a GaN-based semiconductor are exemplarily shown. In order to generate lateral growth of a GaN-based semiconductor crystal, a mask made of silicon oxide may be partially formed on the surface of the substrate 101 or the surface of the substrate 101 may be processed to be uneven, optionally.

In another method employable for obtaining the structure in which the semiconductor laminate 102 composed of GaN-based semiconductors is formed on the substrate 101, the n-type layer 102-1, the light emitting layer 102-2, the p-type layer 102-3 are formed by an epitaxial growth method in this order on a growth substrate to provide the semiconductor laminate 102, the growth substrate is removed from the semiconductor laminate 102 by an etching, grinding, polishing or laser lift-off method, and the substrate 101 prepared separately is attached onto the exposed surface of the n-type layer 102-1. In another employable method, the semiconductor laminate 102 is formed by the similar method, the growth substrate is removed, a seed layer is formed on the exposed surface of the n-type layer 102-1, a metal layer is deposited to be 50 μm or more in thickness by electrolytic plating or electroless plating, and the metal layer serves as the substrate 101. In the above methods, the crystal substrates exemplarily described above are preferably used as the growth substrate. The kind of the substrate that can be attached on the surface of the n-type layer 102-1, and the attaching method are not limited, and with respect to them, the conventionally well-known technique may be properly referred to. Specifically, as the kind of the substrate, the crystal substrates exemplarily described above, a metal substrate, and a glass substrate are exemplarily shown. As the attaching method, a method using a conductive bonding agent (conductive paste or brazing filler metal), a method using an insulative bonding agent, and a direct wafer bonding method are exemplarily shown. When the substrate 101 is formed by a plating method, Au (gold), Ni (nickel), Cu (copper), Ag (silver) and the like are preferably exemplified as a material.

It is preferable to add an n-type impurity such as Si and Ge when the n-type layer 102-1 is formed. A p-type impurity such as Mg and Zn is added when the p-type layer 102-3 is formed. After forming the p-type layer 102-3, an annealing treatment or electron beam irradiation treatment may be performed in order to promote the activation of the added p-type impurity. The light emitting layer 102-2 is not limited by its conductivity type, and may be an undoped layer, a layer provided with n-type or p-type conductivity by impurity addition, or a laminate comprising mixed n-type conductive layers and p-type conductive layers, for example. The composition of the GaN-based semiconductor composing the n-type layer 102-1, the light emitting layer 102-2, the p-type layer 102-3 is not limited, and the GaN-based semiconductor may have any composition such as GaN, AlGaN, InGaN, and AlInGaN. Preferably, compositions of the GaN-based semiconductor composing the light emitting layer and the layers sandwiching it are selected to form a double heterostructure. The light emitting layer preferably has a quantum well structure and more preferably has a multiple quantum well structure in which barrier layers and well layers are alternately laminated. Each of the n-type layer 102-1, the light emitting layer 102-2, and the p-type layer 102-3 is not necessarily homogenous in a thickness direction, and an impurity concentration, crystal composition and the like may vary continuously or discontinuously in a thickness direction in each layer. In addition, an additional layer may be provided between each adjacent two layers.

The laminate 102 may have the following constitution, for example. The n-type layer 102-1: a Si-doped GaN layer having a film thickness of 4 μm and an electron concentration of $5\times10^{18}$ cm$^{-3}$. The light emitting layer 102-2: a multiple quantum well layer formed by alternately laminating GaN barrier layers each having a thickness of 8 nm and InGaN well layers each having a thickness of 2 nm such that an uppermost layer and a lowermost layer are the barrier layers, and the number of the well layers is 2 to 20. The p-type layer 102-3: a laminate having a two-layer structure composed of a p-type clad layer being in contact with the light emitting layer 102-2, and a p-type contact layer laminated thereon. The p-type clad layer is a Mg-doped $Al_{0.1}Ga_{0.9}N$ layer having a film thickness of 100 nm and a Mg concentration of $5\times10^{19}$ cm$^{-3}$. The p-type contact layer is a Mg-doped GaN layer having a thickness of 200 nm and a Mg concentration of $1\times10^{20}$ cm$^{-3}$.

The negative electrode 103 may be formed on the surface of the n-type layer 102-1 exposed by partially removing the p-type layer 102-3 and the light emitting layer 102-2 by using the well-known RIE (reactive ion etching) technique. With respect to the material and the forming method of the negative electrode 103, well-known techniques can be referred to. According to a preferable embodiment, at least the part of the negative electrode 103 being in contact with the n-type layer 102-1 is made of a simple substance of Ti (titanium), Al (aluminum), W (tungsten), V (vanadium) and the like, or an alloy containing one or more metal selected from them. For enabling easy connection to an external electrode, it is preferable to provide a layer made of Ag (silver), Au (gold), Sn (tin), In (indium), Bi (bismuth), Cu (copper), Zn (Zinc) and the like as a surface layer of the negative electrode 103. The negative electrode 103 may contain a thin layer made of a conductive oxide material in the part being in contact with the n-type layer 102-1. The film thickness of the negative electrode 103 may be from 0.2 μm to 10 μm, and preferably from 0.5 μm to 2 μm. The negative electrode 103 may be formed by an evaporation method, sputtering method, CVD method or the like. The negative electrode 103 may be formed after forming the conductive oxide film 104 and the like on the p-type layer 102-3. In addition, when the substrate 101 has conductivity, the negative electrode can be formed on the surface of the substrate. In addition, when the substrate is made of a metal, the substrate itself can be used as the negative electrode.

The conductive oxide film 104 is preferably made of an oxide containing at least one element selected from Zn (zinc), In (indium), Sn (tin), and Mg (magnesium). Specifically, ITO (indium tin oxide), indium oxide, tin oxide, zinc oxide, and magnesium oxide are preferably exemplarily shown. AZO being zinc oxide with added aluminum oxide, GZO being zinc oxide with added gallium oxide, FTO being tin oxide with added fluorine, IZO being indium oxide with added zinc oxide and the like are known as conductive oxide materials that can be used as the electrode of the GaN-based LED element. Among them, ITO is particularly preferable. The film thickness of the conductive oxide film 104 may be from 0.1 μm to 1 μm, and preferably from 0.2 μm to 0.5 μm. The conductive oxide film 104 is preferably formed such that the transmittance at the wavelength of the light emitted from the light emitting layer 102-2 is not less than 80%. This transmittance is more preferably not less than 85%, and still more preferably not less than 90%. In addition, the film thickness may be adjusted in order to achieve a anti-reflection film condition or a high-reflection condition, depending on the wavelength of the light emitted from the light emitting layer 102-2. The conductive oxide film 104 is preferably formed such that its resistivity is not more than $1\times10^{-4}$ Ωcm. As a method for forming the conductive oxide film 104, a method such as a sputtering method, reactive sputtering method, evaporation method, ion beam assist evaporation method, ion plating method, laser ablation method, CVD method, spraying method, spin coating method, and dipping method are exemplarily shown. The formed conductive oxide film 104 may be subjected to a heat treatment as needed. With respect to the method for forming the conductive oxide film 104, the patent document 1 (JP-A-2005-317931 or a corresponding US-A1-2005/212002), the patent document 2 (JP-A-2001-

210867) and the like can be referred to. The first conductive oxide film 104-1 and the second conductive oxide film 104-2 may be patterned by a liftoff method, for example. In addition, the first conductive oxide film 104-1 and the second conductive oxide film 104-2 can be also patterned by removing an unnecessary part by photolithography and etching techniques after formed on the whole surface of the wafer. In dry etching or wet etching, etching rate is decreased as the crystallinity of the conductive oxide film is higher, in general. Thus, when the two conductive oxide films formed on the p-type layer have different crystallinities, only the film with lower crystallinity can be processed by etching. The crystallinity of a conductive oxide film can be controlled by a film forming condition and a heat treatment after the film formation. In general, the lower is the film forming temperature, the lower is the crystallinity of the formed film. In addition, the higher is the temperature of the heat treatment performed after the film formation and the longer is the time thereof, the higher is the crystallinity of the film. A method for making the contact resistance of the conductive oxide film 104 with the p-type layer 102-3 lower in the first contact portion 104A than in the second contact portion 104B is as previously described.

The positive pad electrode 105 is formed after the formation of the conductive oxide film 104. Although the material for the positive pad electrode 105 is not particularly limited, according to a preferable embodiment, at least the part of the positive pad electrode 105 being in contact with the conductive oxide film 104 is made of platinum group (Rh, Pt, Pd, Ir, Ru, Os), Ni (nickel), Ti (titanium), W (tungsten), Ag (silver), Al (aluminum) and the like. It is preferable to provide a reflection layer chiefly composed of Al, Ag or platinum group that is a metal with good reflectivity at the part of the positive pad electrode 105 on the light emitting layer 102-2 side in order to reduce the light absorption by the positive pad electrode. When such reflection layer is provided, a light-transmissive thin film made of Ni, Ti, W, Ti—W and the like may be sandwiched between the reflection layer and the surface of the conductive oxide film, in order to prevent lowering of the bonding force between the positive pad electrode 105 and the conductive oxide film 104. This thin film is formed to have a thickness of 20 nm or less, preferably of 10 nm or less, and more preferably of 5 nm or less. In addition, for enabling easy connection to an external electrode, it is preferable to provide a layer made of Ag (silver), Au (gold), Sn (tin), In (indium), Bi (bismuth), Cu (copper), Zn (zinc) and the like as a surface layer of the positive pad electrode 105. The film thickness of the positive pad electrode 105 may be from 0.2 μm to 10 μm, and preferably from 0.5 μm to 2 μm. The positive pad electrode 105 may be formed by an evaporation method, sputtering method, CVD method or the like.

When the positive pad electrode 105 is composed of the body part 105a and the protrusion part 105b, it is preferable to form the body part 105a in a minimum area enabling connection to an external electrode. For wire bonding, the body part of the positive pad electrode is preferably shaped into a circle or a regular polygon that is a shape with a small aspect ratio. In the case where conductive paste or brazing filler metal is bonded, it is also preferable to shape the body part of the positive pad electrode into a rectangle or trapezoid. Therefore, the preferable shape of the body part of the positive pad electrode is a circle, rectangle, trapezoid, regular polygon, or a shape formed by applying a trivial deformation to each of these shapes. The trivial deformation here includes (a) deformation of warping a circle into an ellipse, (b) deformation of rounding one or more corners of a rectangle or regular polygon, and (c) deformation of curving outward one or more corners of a rectangle or regular polygon. By the way, while a pad electrode needs to have a size and shape capable of encompassing a circle having a diameter of 60 μm for wire bonding according to the state of the art, it is almost certain that the size of a pad electrode usable for wire bonding will become smaller in the future.

Although not shown, after finishing the formation of the negative electrode 103, the conductive oxide film 104, and the positive pad electrode 105, the surface of the LED element 100 on the semiconductor laminate 102 side is preferably covered with a light transmissive insulative protective film except for the surface of the negative electrode 103 and the surface of the positive pad electrode 105 which are required to be exposed for connection with an external electrode. This insulative protective film is preferably made of an insulative metal oxide, metal nitride, or metal oxynitride having high transmittance at the wavelength of the light emitted from the light emitting layer. Since the typical emission wavelength of a GaN-based LED ranges from 350 nm to 600 nm, an insulator having high transmittance in this wavelength range is a preferable material for the insulative protective film. Specifically, a silicon oxide, silicon nitride, silicon oxynitride, aluminum oxide, aluminum nitride, tantalum oxide, zirconium oxide, and hafnium oxide are exemplarily shown. The insulative protective film may have a multilayer film structure. The method for forming the insulative protective film is not limited and the well-known method such as a sputtering method, CVD method, and evaporation method can be used. As a particularly preferable method, a plasma CVD method can be mentioned by which a film having no pinhole and with good adhesion can be formed.

After forming the insulative protective film, the wafer is cut by a wafer separation method ordinarily used in this field (for example, dicing, scribing or laser processing), whereby the GaN-based LED element 100 in chip form is obtained. The size of the chip is not particularly limited and may be from 200 μm square to 2 mm square, for example. The shape of the chip is not limited to a square or rectangle, and it may be a parallelogram, triangle, pentagon, hexagon or the like. The LED elements with various kinds of chip shapes can be produced due to the development of the wafer separation method utilizing laser processing technique.

The GaN-based LED element 100 can be used in various kinds of light emitting devices such as SMD (Surface Mounting Device) type LED package, a bullet-type lamp, a power LED wherein a slug with an LED element mounted on it is fixed to a metal based printed wiring board, and a chip-on-board (COB) type unit wherein an LED element is directly mounted on a unit substrate.

Although the substrate for supporting the GaN-based semiconductor film formed by epitaxial growth is contained in an LED element in each embodiment mentioned above, such constitution is not indispensable. The substrate used for epitaxial growth of the GaN-based semiconductor film can be removed after the LED element has been flip-chip mounted, by using a technique disclosed in JP-A-2007-517404 (WO2005/062905).

The present invention is not limited to the embodiments described expressly in this specification, and various kinds of variations may be added without departing from the spirit and scope of the present invention.

Industrial Applicability

According to the present invention, there is provided a GaN-based LED element having a structure in which light absorption by a pad electrode can be reduced. In addition, according to the present invention, there is provided a light emitting device superior in light emission efficiency by using a GaN-based LED element having a structure in which the light absorption by the pad electrode can be reduced.

This application is based on patent application Nos. 2007-41528, 2007-50783 and 2007-323248 filed in Japan, the contents of which are incorporated in full herein by this reference.

The invention claimed is:

1. A GaN-based LED element comprising:
    a semiconductor laminate composed of a plurality of GaN-based semiconductor layers, the semiconductor laminate including a p-type layer, a light emitting layer arranged on a side of one surface of the p-type layer, and an n-type layer arranged so as to sandwich the light emitting layer between the p-type layer and the n-type layer;
    a light-transmissive conductive oxide film formed on another surface of the p-type layer; and
a positive pad electrode formed on the light-transmissive conductive oxide film,
    wherein the light-transmissive conductive oxide film includes a first conductive film and a second conductive film electrically connected to the first conductive film,
    wherein the light-transmissive conductive oxide film has, in a part in contact with the p-type layer, a first contact portion which is a part of the first conductive film and a second contact portion which is a part of the second conductive film,
    wherein at least a part of the positive pad electrode is formed on the second contact portion,
    wherein a current supplied from the light-transmissive conductive oxide film to the p-type layer flows to the p-type layer mainly through the first contact portion,
    wherein the GaN-based LED element has an unevenness artificially formed in a surface of the light-transmissive conductive oxide film in a region not covered by the positive pad electrode,
    wherein the light-transmissive conductive oxide film has a multilayer structure part composed of a plurality of films including the first conductive film, on an interface between the first contact portion and the p-type layer, such that the unevenness is formed in the surface of the multilayer structure part,
    wherein the multilayer structure part includes the second conductive film, and
    wherein a part of the second conductive film formed on the first conductive film has a dot-shaped, stripe-shaped, or net-shaped pattern to serve as a convex part.

2. The GaN-based LED element of claim 1, wherein a contact resistance of the light-transmissive conductive oxide film with the p-type layer is lower in the first contact portion than in the second contact portion.

3. The GaN-based LED element of claim 1, wherein a contact between the first contact portion and the p-type layer is ohmic, and a contact between the second contact portion and the p-type layer is non-ohmic.

4. The GaN-based LED element of claim 1, wherein at least 25% of an area of the positive pad electrode is formed on the second contact portion.

5. The GaN-based LED element of claim 1, wherein a whole of the positive pad electrode is formed on the second contact portion.

6. The GaN-based LED element of claim 1,
    wherein the positive pad electrode is composed of a body part used for bonding to a material used for making a connection to an external electrode, and a protrusion part projecting from the body part, and
    wherein at least a whole of the body part of the positive pad electrode is formed on the second contact portion.

7. The GaN-based LED element of claim 1, wherein a part of the second conductive film formed on the first conductive film is made into the dot-shaped pattern to serve as the convex part.

8. The GaN-based LED element of claim 1, wherein the positive pad electrode has a reflection layer made of Al, Ag, or a platinum group element as a main component.

9. A light emitting device wherein the GaN-based LED element of claim 1 is flip-chip mounted.

* * * * *